United States Patent
Heightley

(10) Patent No.: US 7,061,322 B2
(45) Date of Patent: Jun. 13, 2006

(54) LOW VOLTAGE DIFFERENTIAL AMPLIFIER CIRCUIT AND BIAS CONTROL TECHNIQUE ENABLING ACCOMMODATION OF AN INCREASED RANGE OF INPUT LEVELS

(75) Inventor: John Heightley, Colorado Springs, CO (US)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/868,235

(22) Filed: Jun. 15, 2004

(65) Prior Publication Data

US 2005/0275463 A1 Dec. 15, 2005

(51) Int. Cl.
*H03F 3/45* (2006.01)

(52) U.S. Cl. .................................... 330/261

(58) Field of Classification Search ............... None
See application file for complete search history.

(56) References Cited

U.S. PATENT DOCUMENTS

| | | | |
|---|---|---|---|
| 4,460,874 A * | 7/1984 | Haque | 330/261 |
| 4,658,157 A | 4/1987 | McGowan | |
| 5,045,806 A * | 9/1991 | Yan | 330/252 |
| 5,142,244 A | 8/1992 | Glica et al. | |
| 6,140,877 A | 10/2000 | Forbes | |
| 6,509,795 B1 * | 1/2003 | Ivanov | 330/253 |
| 6,614,301 B1 * | 9/2003 | Casper et al. | 330/253 |

* cited by examiner

*Primary Examiner*—Robert Pascal
*Assistant Examiner*—Alan Wong
(74) *Attorney, Agent, or Firm*—William J. Kubida; Peter J. Meza; Hogan & Hartson LLP

(57) ABSTRACT

A differential amplifier design and bias control technique of particular applicability for low voltage operation in which the threshold voltage of n-channel differential input transistors is controlled using substrate bias in order to allow a wider range of input signal levels. Further disclosed is a technique for controlling the substrate bias of the input transistors of a differential amplifier based on the level of the output of the amplifier in addition to a differential amplifier circuit capable of low voltage operation in which an additional bias current is introduced that enables the output pull-up current to be increased without increasing the pull-down current.

24 Claims, 9 Drawing Sheets

700

LOW VOLTAGE DIFFERENTIAL AMPLIFIER CIRCUIT AND BIAS CONTROL TECHNIQUE ENABLING ACCOMMODATION OF AN INCREASED RANGE OF INPUT LEVELS

BACKGROUND OF THE INVENTION

The present invention relates, in general, to the field of differential amplifiers. More particularly, the present invention relates to a differential amplifier circuit of especial applicability to low voltage operations and a bias technique for enabling the accommodation of an increased range of input levels.

Differential amplifiers are utilized to amplify, and produce an output signal which is a function of the difference between two differential, or complementary, input signals and to thereby enable the detection of relatively weak signal levels while inherently rejecting noise common on the differential input lines. In this regard, conventional integrated circuit differential amplifier designs have included the provision of a differential pair of input transistors having a current mirror load and which are also coupled to a current source for providing a single output signal in response. However, as transistor dimensions and power supply levels tend to decrease, the ideal operational characteristics of such conventional circuit designs cannot be achieved and the functionality of the circuit becomes increasingly dependent on transistor parameters, temperature and operating voltages to a highly significant degree.

SUMMARY OF THE INVENTION

In accordance with the present invention, a low voltage differential amplifier circuit and bias control techniques are disclosed which enable the accommodation of an increased range of input signals.

In a particular embodiment thereof, the invention disclosed is a differential amplifier which provides substantially symmetrical voltage transitions at an output thereof in response to differential input signals supplied thereto. The amplifier comprises a current mirror coupled to a supply voltage source, a differential pair for receiving the differential input signals coupled to the current mirror and defining the output therebetween, a current source for coupling the differential pair to a reference voltage source and a current path coupled between the current mirror and the reference voltage source.

In another embodiment thereof, the invention disclosed provides a differential amplifier which comprises a current mirror comprising first and second transistors having first, second and control terminals thereof with the current mirror being coupled to a supply voltage source. A differential pair comprising third and fourth transistors having first, second, control and substrate terminals thereof is coupled to the current mirror. A current source comprising a fifth transistor having first, second and control terminals thereof is coupled to the differential pair and a reference voltage source and a control circuit is coupled to the substrate terminals of the third and fourth transistors for controlling their threshold voltage.

Particularly disclosed herein is a differential amplifier of especial applicability for low voltage operation that controls the threshold voltage of n-channel differential input transistors using substrate bias in order to allow a wider range of the input levels. Still further disclosed herein is a differential amplifier of especial applicability for low voltage operation in which an additional bias current is introduced that enables the output pull-up current to be increased without increasing the pull-down current.

In a further embodiment thereof, the invention disclosed provides a method for generating and controlling the substrate bias of a differential amplifier comprising a differential amplifier identical to the differential amplifier whose substrate bias is to be controlled. One input of said identical amplifier is set to a fixed bias and the other input is connected to one of the inputs of the differential amplifier whose substrate bias is to be controlled. The output of said identical differential amplifier is compared to a second fixed bias and a control signal is generated according to this comparison that in-turn controls the substrate bias of all differential amplifiers.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
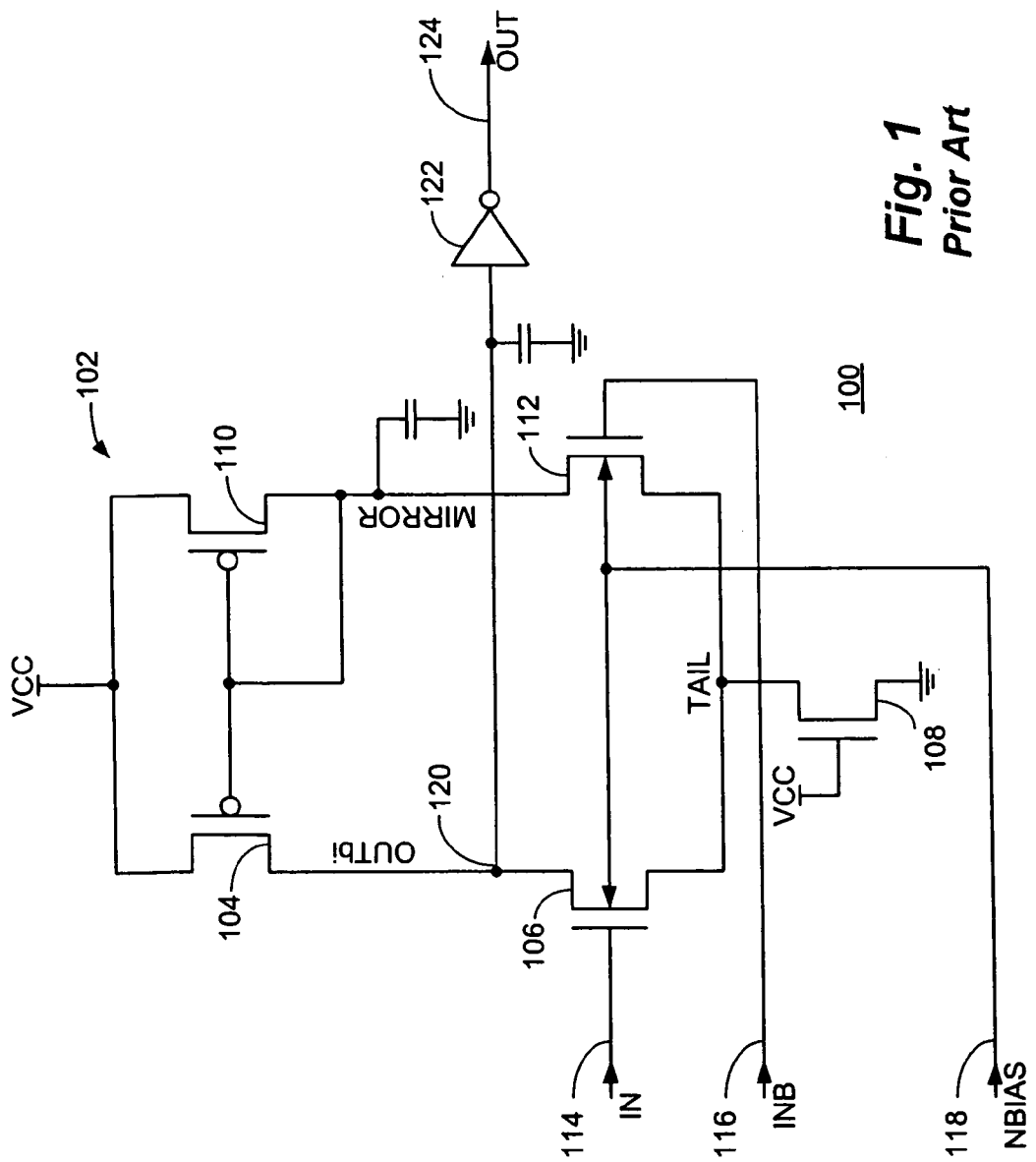
FIG. 1 is a schematic diagram of a conventional MOS differential amplifier.

With reference now to FIG. 1, a schematic diagram of a conventional MOS differential amplifier 100 is shown. The conventional MOS differential amplifier 100 comprises, in pertinent part, a current mirror and differential pair circuit 102 comprising series connected P-channel transistor 104 and N-channel transistor 106 in parallel with series connected P-channel transistor 110 and N-channel transistor 112. The source terminals of transistors 104 and 110 are connected to a supply voltage source (VCC) while the source terminals of transistors 106 and 112 (node TAIL) are coupled to a reference voltage level of circuit ground through current source N-channel transistor 108 which has its gate terminal connected to VCC.

The gate terminals of transistors 104 and 110 are coupled together to the drain terminal of transistor 110 (node MIRROR) which has a parasitic capacitance as indicated. Transistors 104 and 100 thus form the well known current mirror circuit configuration. The gate terminal of transistor 106 is connected to an input line 114 (IN) while the gate terminal of transistor 112 is connected to a complementary input line 116 (INB). The back gate, or substrate contacts of transistors 106 and 112 are coupled together to a third input line 118 (NBIAS). Output from the conventional MOS differential amplifier 100 is taken at the common connected drain terminals of transistors 104 and 106 at node 120 (node OUTbi) for input to an inverter 122 and subsequent output on line 124 (OUT). The node 120 also exhibits a parasitic capacitance as indicated.

In the conventional MOS differential amplifier 100 illustrated, it is desirable to have transistor 108 operated in the saturated region in order to make the current through the amplifier 100 relatively independent of the drain-to-source voltage ($V_{DS}$) of transistor 108 and the absolute level of the voltage on IN line 114 and INB line 116. The output voltages, (OUTbi) at node 120 and MIRROR at the drain of transistor 110 are then determined by the gate-to-source voltage (VGS) of transistor 108 and the difference between the voltages on IN line 114 and INB line 116 and are independent of the absolute level of these voltages (common mode level). The inverter 122 is included to sharpen the output on line 124 and give a full swing between the power supply level VCC and ground.

Figure 2:
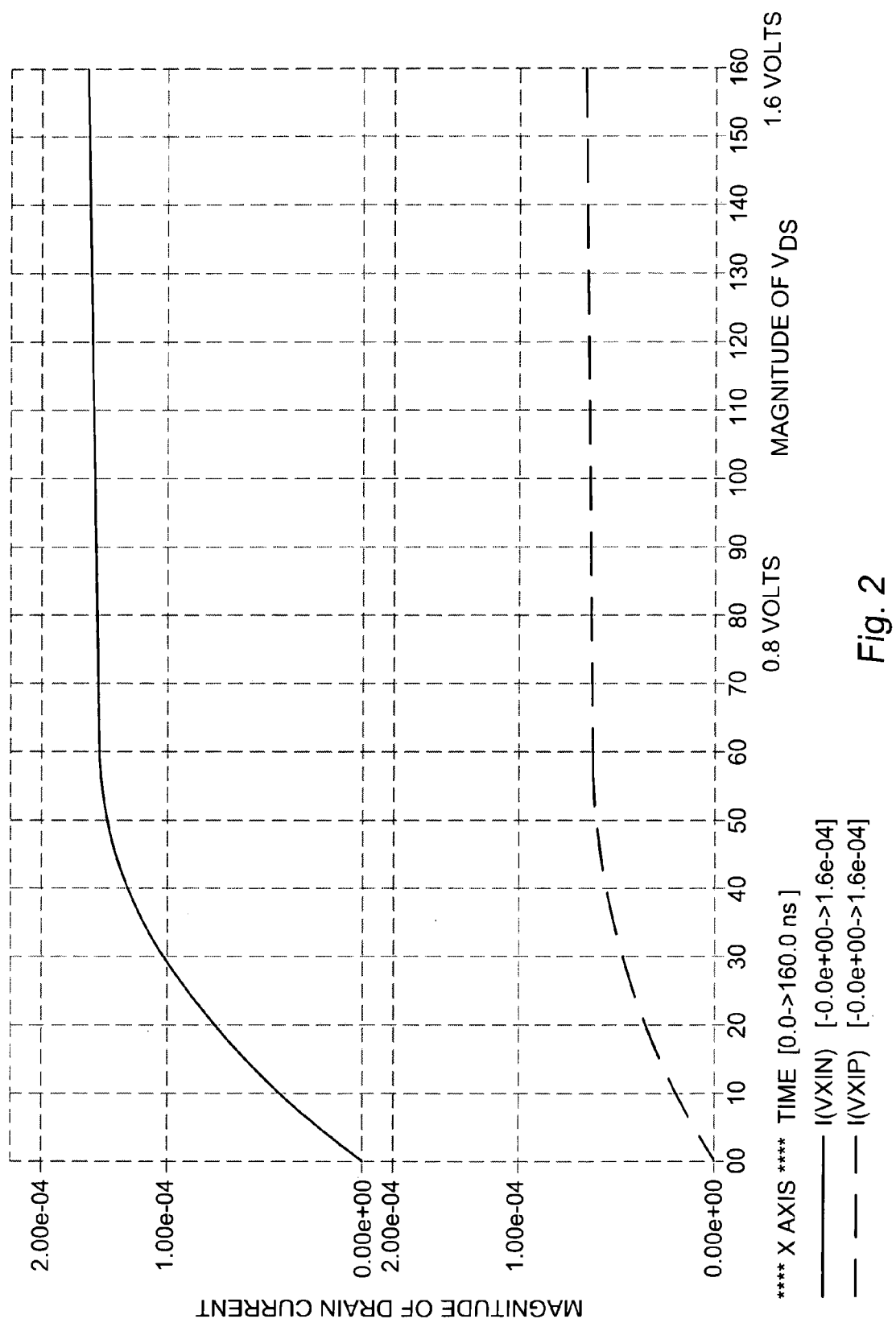
FIG. 2 is a graphical illustration of the drain current for N-channel transistors having a channel length of 1.0μ and a width of 2.8μ and for P-channel transistors having a channel length of 1.0μ and a width of 6.0μ as a function of the magnitude of the drain-to-source voltage (Vds) and with the magnitude of the gate-to-source voltage (Vgs) equal to 1.6 volts in both cases.

With reference additionally now to FIG. 2, a graphical illustration of the drain current for N channel transistors having a channel length of 1.0μ and a width of 2.8μ in conjunction with P-channel transistors having a channel length of 1.0μ and a width of 6.0μ as a function of the magnitude of Vds for a magnitude of $V_{GS}$=1.6 volts in both cases. As can be determined, both transistors exhibit fairly flat saturation characteristics above approximately 0.6 volts of $V_{DS}$.

Figure 3:
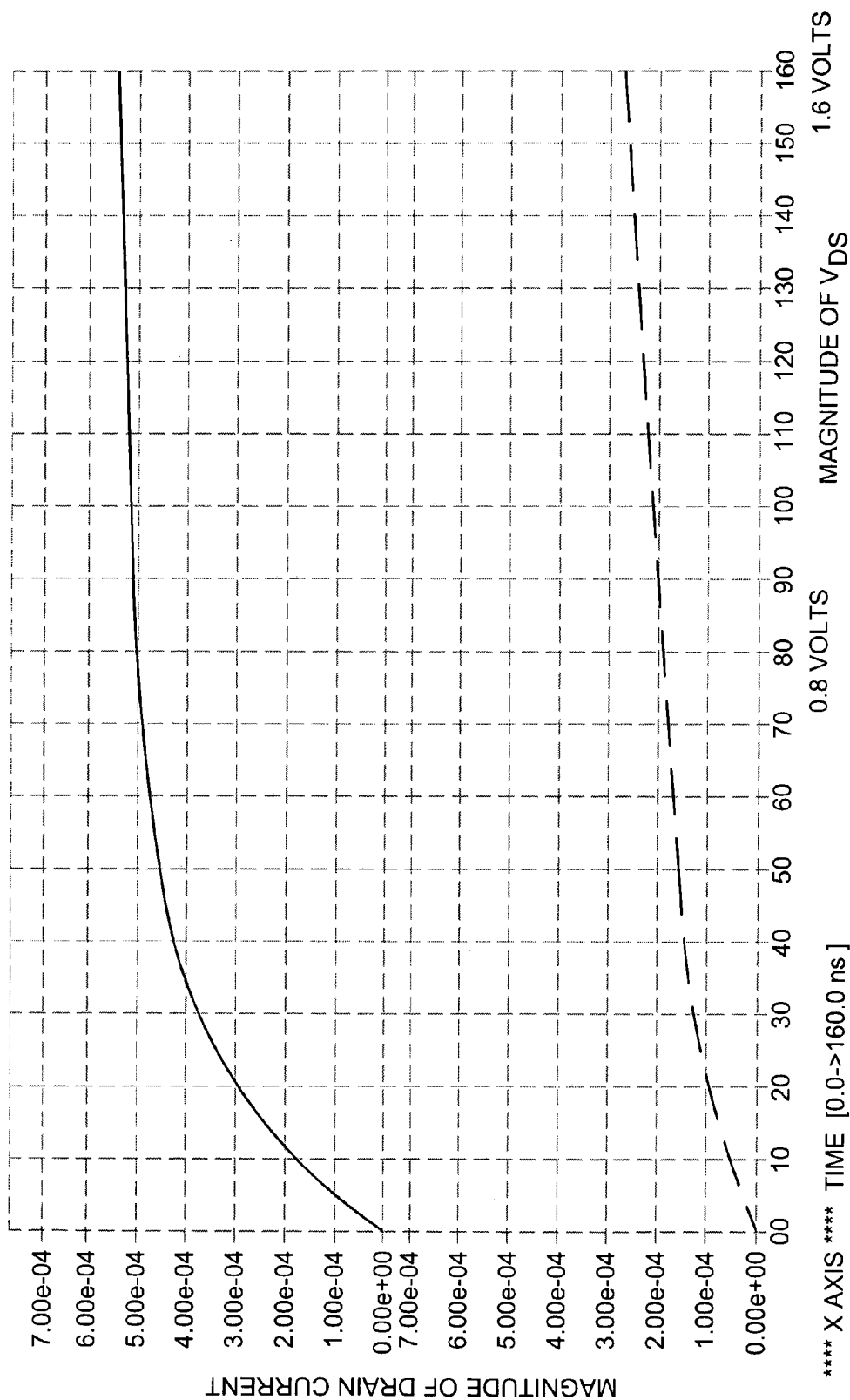
FIG. 3 is a plot of the drain current characteristics for the transistors illustrated in FIG. 1 but with minimum channel lengths of 0.20μ and 0.21μ for the N and P devices respectively.

With reference additionally now to FIG. 3, another graphical illustration is shown depicting the drain current characteristics for the transistors illustrated in FIG. 1, but having minimum channel lengths of 0.20μ and 0.21μ for the N-type and P-type devices respectively. It is clear that the $V_{DS}$'S must be greater than approximately 0.6 volts to be near to being in saturation and independent of $V_{DS}$. However, as the channel lengths approach these minimums, the transistors never actually saturate.

Figure 4:
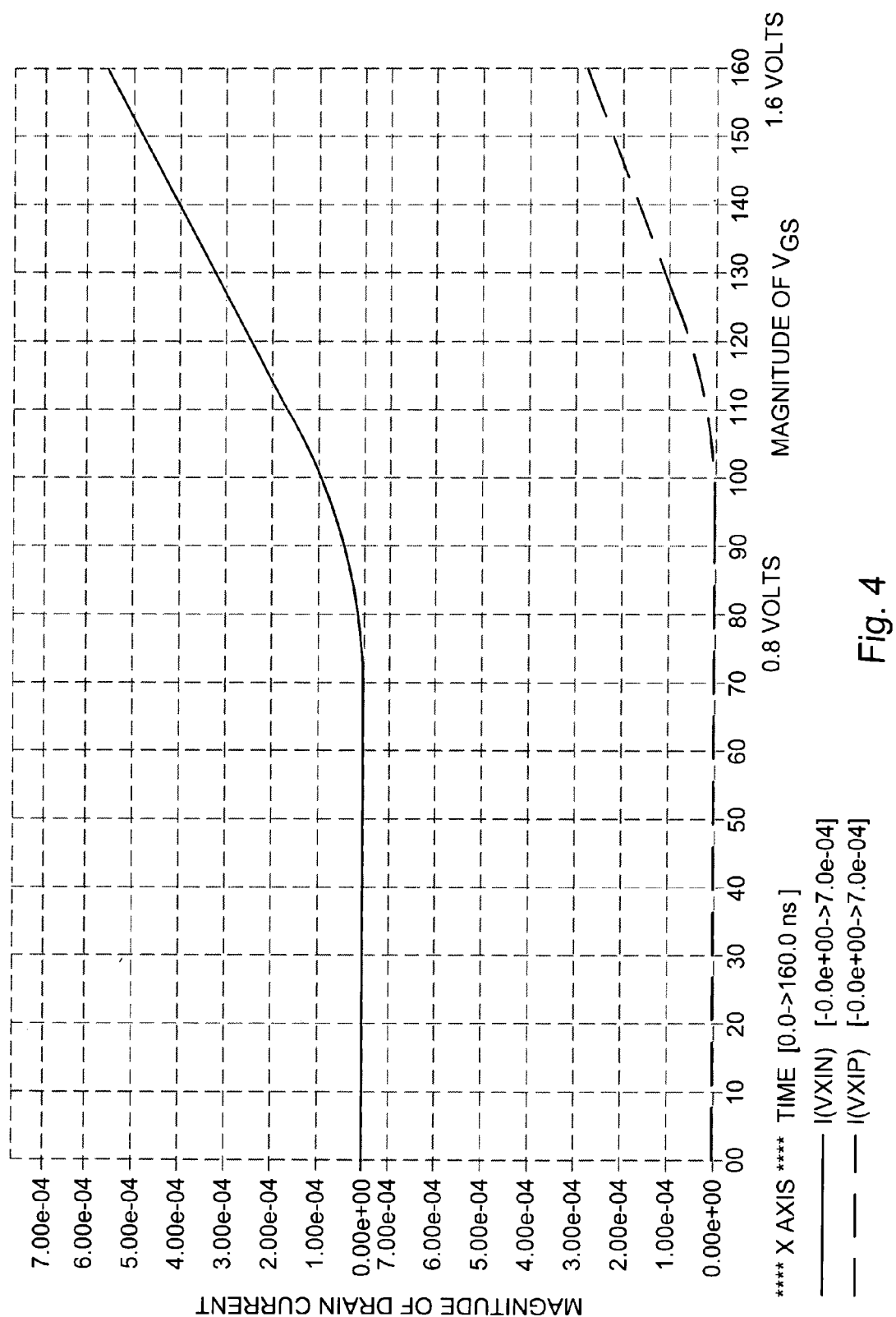
FIG. 4 illustrates the drain current of the two minimum channel length transistors of the preceding figure as a function of the magnitude of $V_{GS}$ with the magnitude of $V_{DS}$=1.6 volts.

With reference additionally now to FIG. 4, a further graphical illustration shows the drain current of the two minimum channel length transistors of the preceding figure as a function of the magnitude of $V_{GS}$ with the magnitude of $V_{DS}$=1.6 volts. The n-channel device requires at least 1.0 volts to have a drain current of 100 μA and the p-channel device requires 1.25 volts of $V_{GS}$ to have 100 μA of current. Given these characteristics, the power supply voltage for the amplifier 100 must be on the order of 2.0 volts for transistor 108 to barely operate in the saturated region and the minimum high value of the signals IN or INB must be at least 1.6 volts with a differential voltage large enough to steer virtually all of the current to the side with the high input level.

In accordance with present day CMOS technologies, the supply voltage VCC can be 1.6 volts or even lower. Further, in some products using comparable differential amplifiers 100 as input buffers, only the IN signal path on line 114 switches while the INB signal on line 116 is held at a fixed reference voltage that can be as low as 0.8 volts.

Clearly none of the requirements for ideal operation of the amplifier 100 can be met under these conditions and the behavior of the amplifier 100 will be sensitive to variations in transistor parameters, temperature, and operating voltages to a very significant degree. With only 0.8 volts applied on INB line 116, the node TAIL must essentially go to ground in order for there to be any current flow through transistor 112 when the IN signal on line 114 goes below 0.8 volts and there will be very little VDS across transistor 108.

Therefore, the current through transistor 108 will be very dependent on the $V_{DS}$ of the transistor itself. In addition, the node MIRROR will have to be more than 0.8 volts below the power supply VCC in order for any current to flow through transistor 110 which, in turn, will be mirrored through transistor 104. Therefore, transistor 112 will have on the order of 0.7 volts of $V_{DS}$ when all of the current flows through the right side of the amplifier 100. Because all of the transistors are operating with very little $V_{DS}$ and $V_{GS}$, the channel lengths need to be essentially at the minimum allowable lengths, previously described, in order to have reasonable channel widths.

Figure 5:
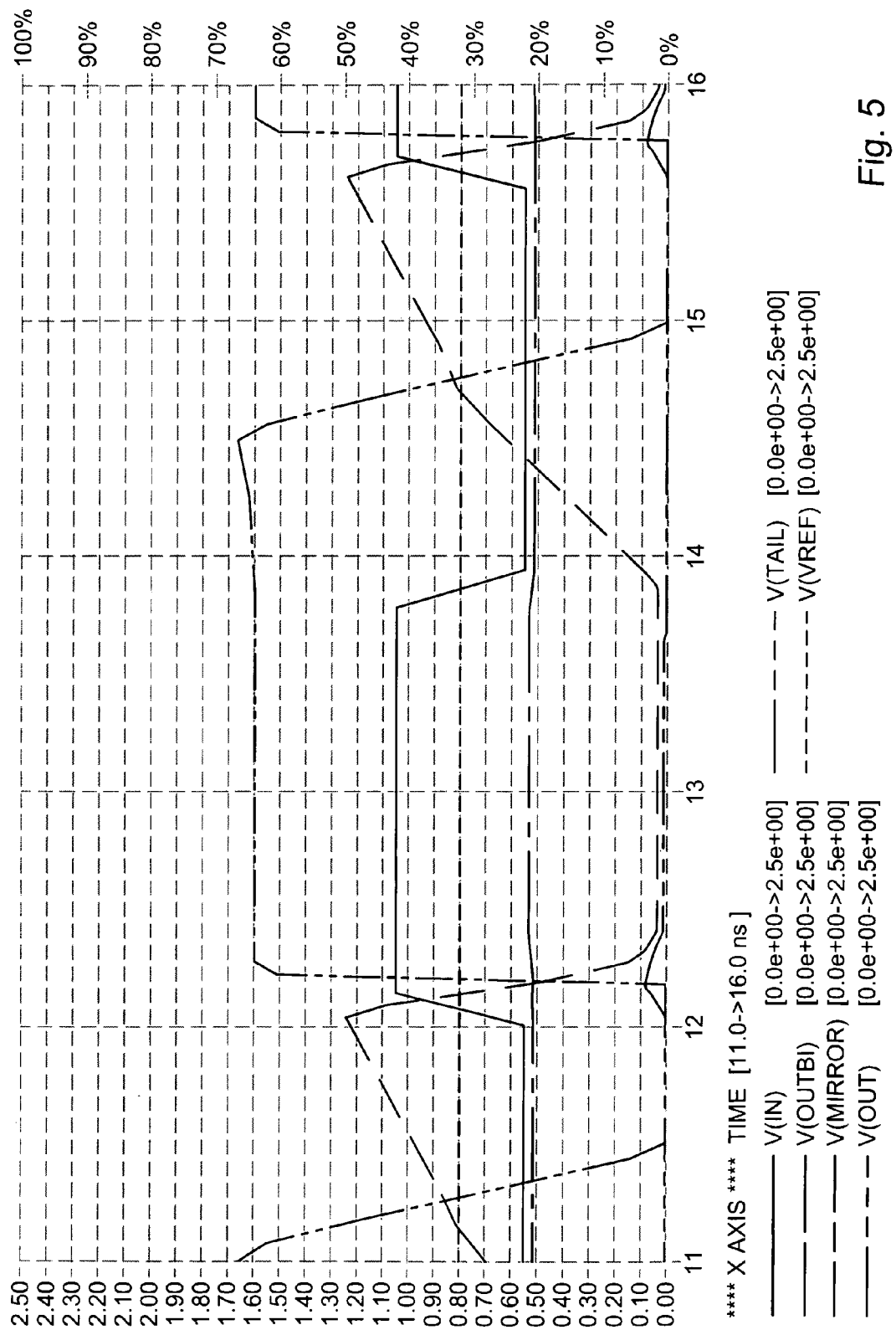
FIG. 5 is a simulation of the circuit shown in FIG. 1 with the power supply at 1.6 volts, INB fixed at 0.8 volts, IN transitioning 0.25 volts above and below 0.8 volts, and with the substrate bias (NBIAS) of transistors 106 and 112 at 0 volts as is customary.

With reference additionally now to FIG. 5, a simulation of the operation of the amplifier 100 circuit shown in FIG. 1 is illustrated with the power supply VCC at 1.6 volts, the INB signal on line 116 fixed at 0.8 volts, the IN signal on line 114 transitioning 0.25 volts above and below 0.8 volts, and with the substrate bias (NBIAS) of transistors 106 and 112 at 0.0 volts as is customary. With reference to this figure, it is clear that the output of the differential amplifier 100 OUTbi is very distorted and asymmetrical. The primary problem arises because with the signal INB at 0.8 volts, there is very little current through transistor 112 even though the node TAIL is essentially at ground. This, in turn, results in very little current through transistor 110 to be mirrored through transistor 104 to pull node OUTbi high. The overall result is that the signal OUT on line 124 has a very distorted duty cycle. The root cause of the problem is that the threshold voltage of transistor 112 is too high. One way to lower the threshold is to bias the substrate of transistor 112 slightly positive with respect to ground.

Figure 6:
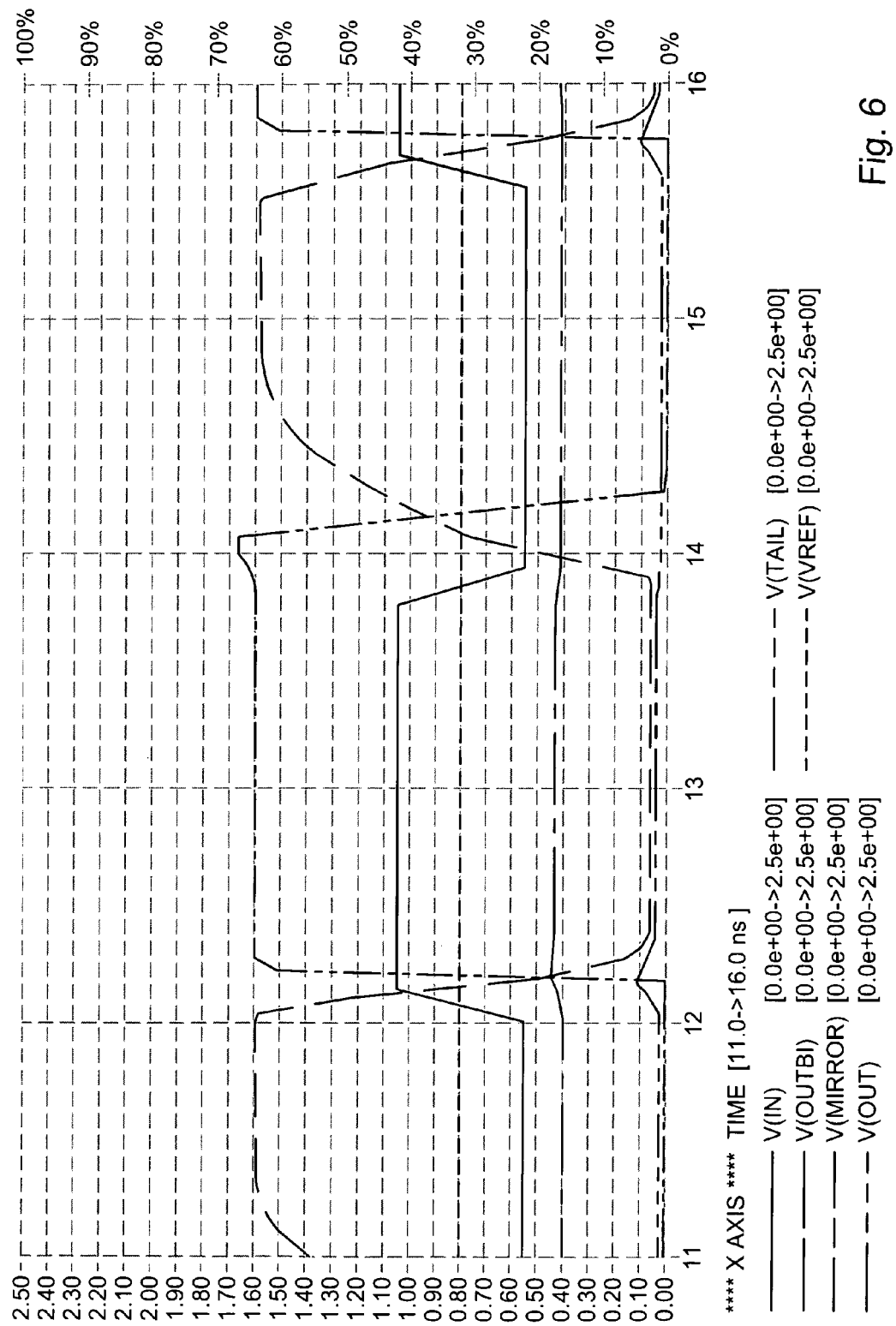
FIG. 6 illustrates the behavior of the circuit of FIG. 1 under identical conditions to those illustrated in the preceding figure except that the substrate bias (NBIAS) of transistors 106 and 112 is set at 0.5 volts.

With reference additionally now to FIG. 6, the behavior of the amplifier 100 circuit is shown under conditions identical to those previously described for the simulation of the preceding figure except that the substrate bias (NBIAS) of transistors 106 and 112 is set at 0.5 volts (even though it is the threshold voltage of transistor 112 that is too high, transistor 106 has its substrate biased in order to maintain symmetry). As can be determined, the behavior of the amplifier 100 circuit is significantly improved as a result but is still asymmetrical with the output having a duty cycle of 55.6%.

When the p-channel transistors 104, 110 are "slow" (high threshold voltage, low saturation current) and the n-channel transistors 106, 112 are "fast," (low threshold voltage, high saturation current) and the common mode level of the inputs IN and INB are high, the reduced threshold voltages with positive bias on NBIAS are too low and the behavior of the amplifier 100 is adversely affected. Under these conditions, the node OUTbi is pulled too low when the signal IN is high. Under the above transistor and bias conditions, the level of NBIAS needs to be set to 0V. A means is therefore required for responding to variations in transistor characteristics, voltages and temperature in order to control the substrate bias (NBIAS).

Figure 7:
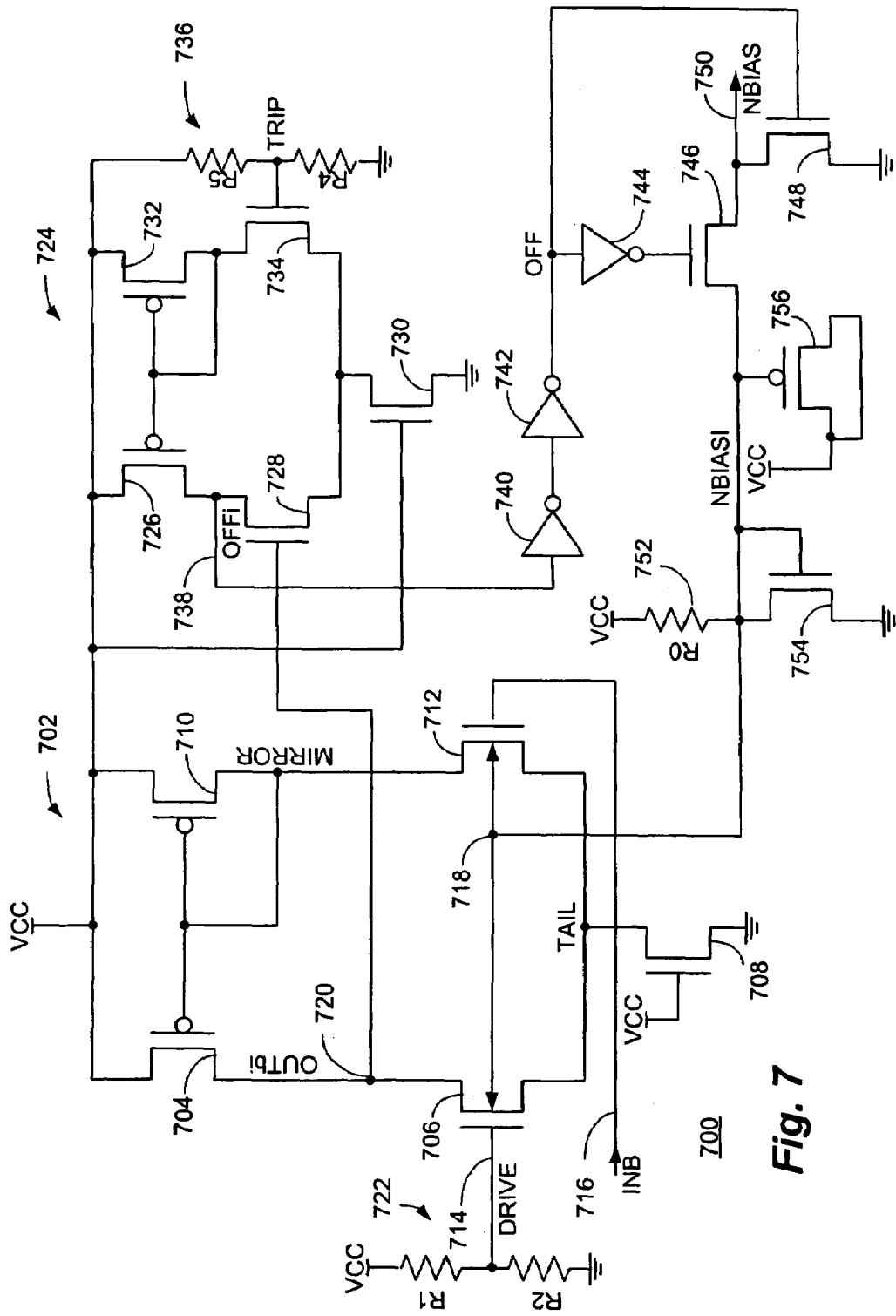
FIG. 7 is a schematic illustration of a circuit in accordance with the present invention that generates and controls the substrate bias (NBIAS) of a differential amplifier that is identical in all respects to the amplifier shown in FIG. 1.

With reference additionally now to FIG. 7, a circuit 700 is shown that generates and controls the level of NBIAS. The circuit 700 comprises, in pertinent part, a first differential amplifier 702 identical in all respects to the differential amplifier whose substrate bias is to be controlled, which in this embodiment is the differential amplifier shown in FIG. 1. The input to the differential amplifier 702 connected to the node "DRIVE" is equivalent to the input of the amplifier in FIG. 1 that is tied to input "IN". The node DRIVE is set to a reference voltage determined by the resistor voltage divider consisting of resistors R1 and R2. This reference level is set slightly below the reference level on the second input to the differential amplifier 702 "INB" which is connected to the same signal as the second input terminal of the differential amplifier whose substrate bias is to be controlled, "INB" in the case of FIG. 1. The output of differential amplifier 702 is taken at the common connected drain terminals 720 (OUTbi) of transistors 704 and 706 as shown. As transistor characteristics, supply voltage, temperature and the level of "INB" change, the output level of amplifier 702 will change. By properly choosing the resistors R1 and R2, the changes in the output of differential amplifier 702 can be made to reflect the changes in the output of the differential amplifier whose substrate bias is to be controlled, FIG. 1 in this case, due to the same transistor, supply voltage, and temperature changes.

The circuit 700 further comprises a second current mirror and differential amplifier 724 comprising series connected P-channel transistor 726 and N-channel transistor 728 in parallel with series connected P-channel transistor 732 and N-channel transistor 734. The source terminals of transistors 726 and 732 are connected to VCC while the source terminals of transistors 728 and 734 are coupled to a reference voltage level of circuit ground through current source N-channel transistor 730 which has its gate terminal connected to VCC.

The gate terminals of transistors 726 and 732 are coupled together to the drain terminal of transistor 732 forming a current mirror. The gate terminal of transistor 728 is connected to OUTbi node 720 while the gate terminal of transistor 734 is connected intermediate series connected resistors R4 and R5 (node TRIP) comprising a voltage divider 736 connected between VCC and ground.

The node 738 (OFFi) intermediate transistors 726 and 728 is provided as input to a pair of series connected inverters 740, 742 for input (OFF) to an additional inverter 744 and the gate terminal of N-channel transistor 748. The substrate contacts of transistors 706 and 712, connected to node 718, are also coupled to a node (NBIASI) intermediate a series connected resistor 752 (R0) and N-channel transistor 754 coupled between VCC and ground as shown. The gate terminal of the transistor 754 is also coupled to node 718 as is the gate terminal of P-channel transistor 756 which has its source and drain terminals coupled together to VCC. Transistor 756 acts as a filter capacitor on node NBIASI. The NBIASI signal on node 718 is also supplied to one terminal of N-channel transistor 746 for supplying an NBIAS signal on line 750. The output of inverter 744 is supplied to the gate terminal of transistor 746 while transistor 748 couples line 750 to ground in response to the OFF signal applied to its gate terminal.

The node OUTbi 720 is monitored via the second differential amplifier 724 and compared to a reference voltage on node TRIP. If the node OUTbi 720 falls below the level of TRIP sufficiently, the second differential amplifier switches and causes NBIAS signal on line 750 to go to ground, otherwise the voltage on line 718 (NBIASI), which is set by the drop across transistor 754, is passed through transistor 746 to line 750 (NBIAS).

As shown previously with respect to the conventional MOS differential amplifier 100 shown in FIG. 1 with transistor 108 operating in the saturation region and with adequate differential input signals, the pull-down current for node 120 OUTbi through transistor 106 when the IN signal on line 114 is "high" with respect to the signal INB on line 116 is determined by the current through transistor 108 as a result of its fixed $V_{GS}$. The current is also independent of the absolute level of the signal IN. The pull-up current for node 120 OUTbi through transistor 104 when IN is "low" with respect to INB is equal to the current through current mirror transistor 110 which is again equal to the current through transistor 108. This current is also independent of the absolute level of the signal INB on line 116. Therefore, the rising and falling edge transitions on node 120 OUTbi are essentially the same since the charging currents for the load capacitance at the input of the inverter 122 are the same for both transitions.

As previously described, the ideal characteristics cannot be achieved and the currents through transistors 106 and 112 are no longer totally controlled by the $V_{GS}$ of transistor 108, but also depend on the absolute level of the voltages on IN line 114 and INB line 116. The "high" value of IN is higher than the "high" value of INB since the signal IN swings above and below the fixed reference level on INB. Thus the pull-down current through transistor 106 when IN is "high" will be greater than the current through transistor 112 when IN is "low" resulting in less pull-up current through transistor 104. Further, the pull-up current through transistor 104 is not identical to the current through current mirror transistor 110 due to the different drain-to-source voltages of the two transistors. The net result of these divergences from ideal is that the pull-down current on node 120 OUTbi is greater than the pull-up current and the falling and rising edge voltage transitions are not symmetrical as can be determined from FIG. 6.

In order to achieve symmetrical transitions, the pull-up current must be increased without increasing the pull-down current. In accordance with the present invention, this is achieved by adding an additional current path from the node MIRROR to ground that does not flow through transistor 108 (FIG. 1).

Figure 8:
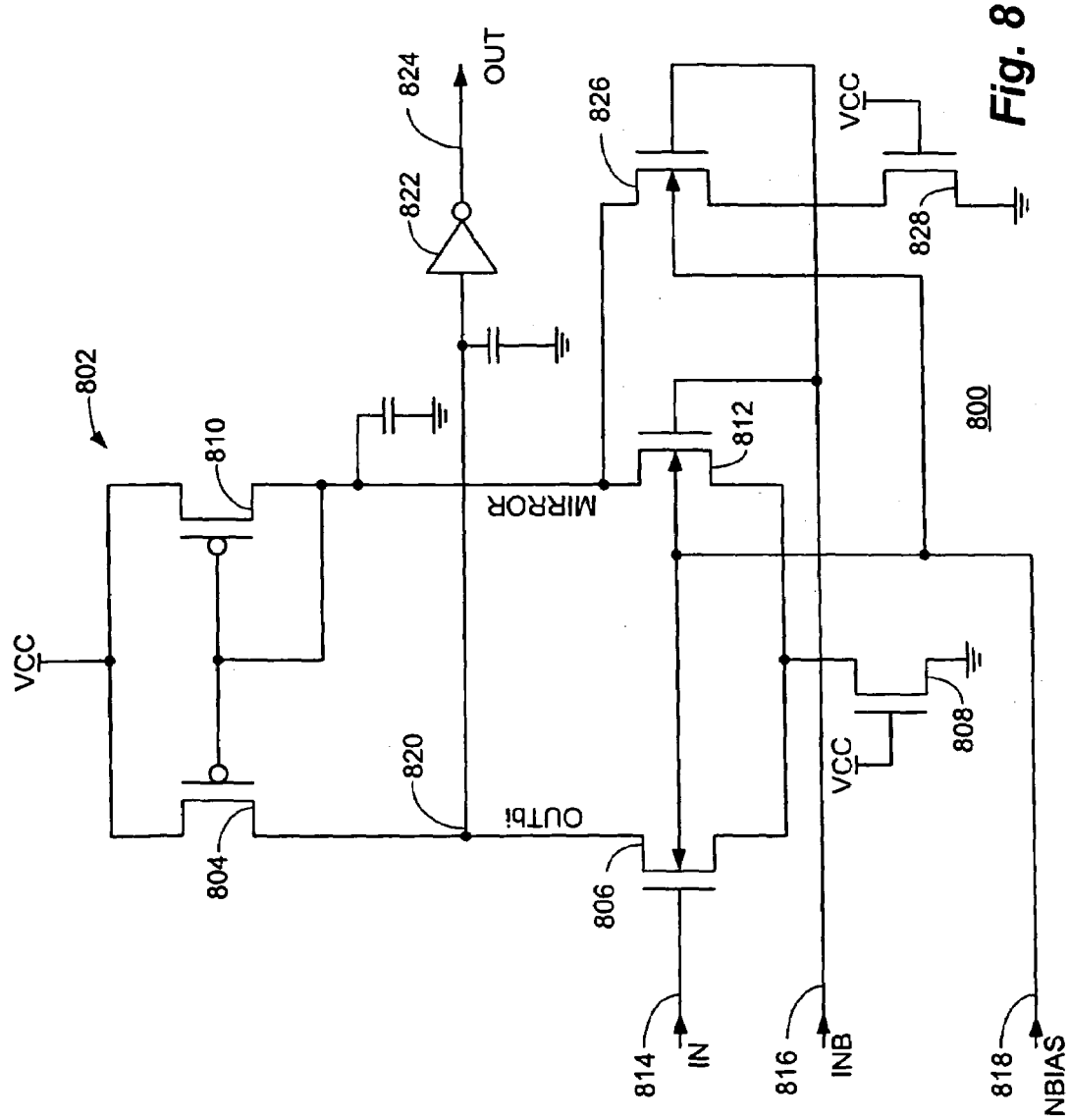
FIG. 8 is a further schematic illustration of another representative differential amplifier circuit in accordance with the present invention in which the pull-up current is increased without increasing the pull-down current in order to achieve symmetrical transitions through the addition of a current path from the node MIRROR to ground that does not flow through transistor 808.

With reference additionally now to FIG. 8, a differential amplifier circuit 800 in accordance with the present invention is shown in which the pull-up current is increased without increasing the pull-down current in order to achieve symmetrical transitions through the addition of a current path from the node MIRROR to ground that does not flow through transistor 808 (corresponding to transistor 108 of FIG. 1).

The differential amplifier circuit 800 comprises, in pertinent part, a current mirror and differential amplifier 802 comprising series connected P-channel transistor 804 and N-channel transistor 806 in parallel with series connected P-channel transistor 810 and N-channel transistor 812. The source terminals of transistors 804 and 810 are connected to VCC while the source terminals of transistors 806 and 812 are coupled to circuit ground through current source N-channel transistor 808 which has its gate terminal connected to VCC. The transistors 804 and 810 comprise a current mirror while the transistors 806 and 812 comprise a differential pair. The transistor 808 comprises a current source.

The gate terminals of transistors 804 and 810 are coupled together to the drain terminal of transistor 810 (node MIRROR) which has a parasitic capacitance as indicated. The gate terminal of transistor 806 is connected to an input line 814 (IN) while the gate terminal of transistor 812 is connected to a complementary input line 816 (INB). The back gate, or substrate contacts of transistors 806 and 812 are coupled together to a third input line 818 (NBIAS). Output from the differential amplifier circuit 800 is taken at the common connected drain terminals of transistors 804 and 806 at node 820 (node OUTbi) for input to an inverter 822 and subsequent output on line 824 (OUT). The node 820 also exhibits a parasitic capacitance as indicated.

The differential amplifier circuit 800 further comprises an additional current path as previously described which includes series coupled N-channel transistors 826 and 828 coupled between the drain terminal of transistor 810 and ground with the substrate contact of transistor 826 coupled to line 818 and its gate terminal coupled to line 816. The gate terminal of transistor 828 is coupled to VCC as shown.

Through the provision of this additional current path, as additional current flows through transistor 810, the $V_{GS}$ of transistor 810 and, in-turn, that of transistor 804 increase and the pull-up current will thus increase without affecting the pull-down current through transistor 806. The size of transistors 826 and 828 can be adjusted so that the pull-up current through transistor 804 is sufficient to provide symmetrical voltage transitions.

Figure 9:
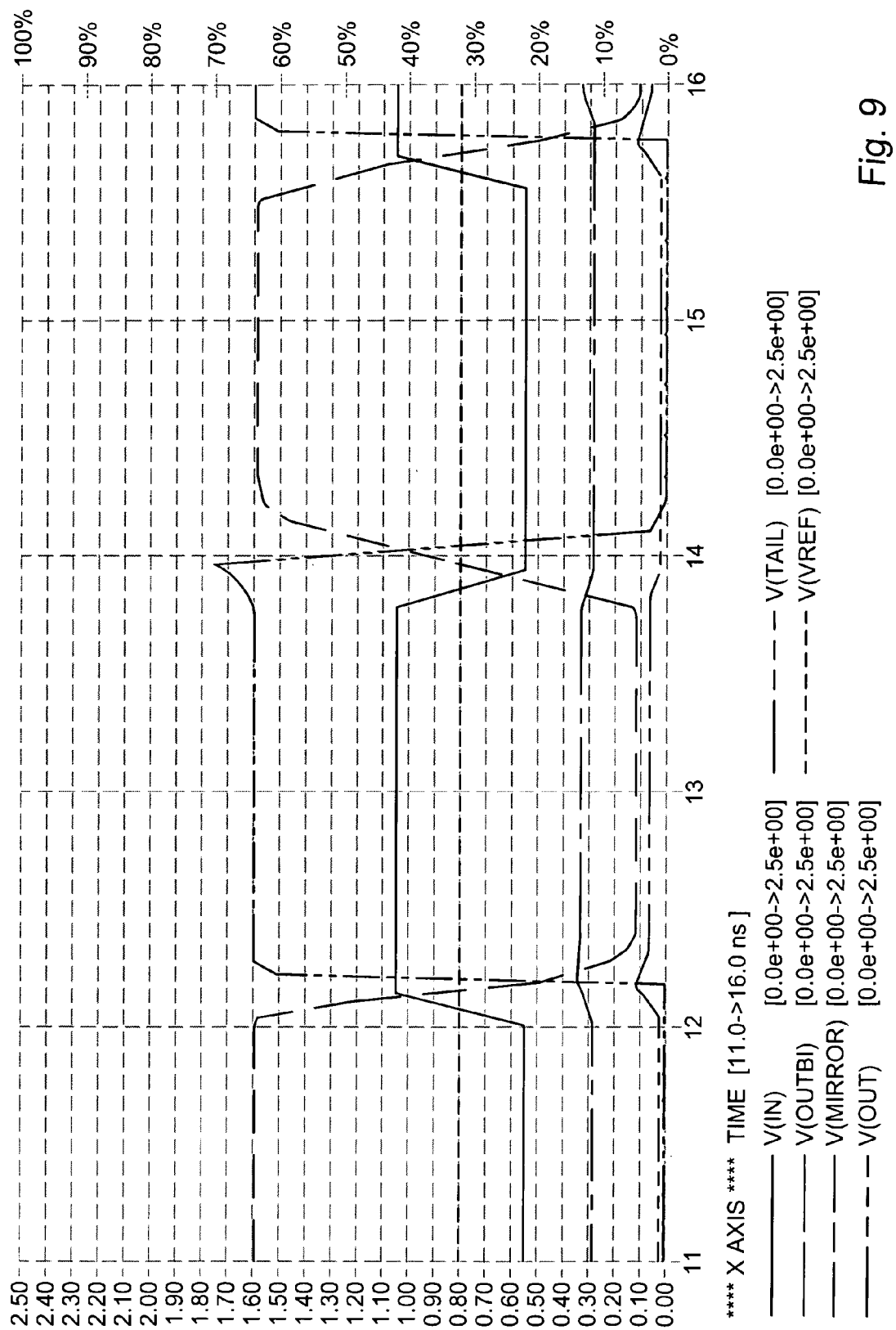
FIG. 9 is a plot of the response of the circuit shown in the preceding figure under the same conditions described with respect to the simulation shown in FIG. 6.

With reference additionally now to FIG. 9, the response of the differential amplifier circuit 800 shown in the preceding figure is illustrated under the same conditions described with respect to the simulation previously shown and described with respect to FIG. 6. The positive and negative transitions on node 820 OUTbi are now nearly symmetrical and the duty cycle is very close to 50%. The differential amplifier circuit 800 shown in FIG. 8 may preferentially replace the first differential amplifier 702 shown in FIG. 7 in order to enable the NBIAS control circuit to more accurately track the behavior of the differential amplifier circuit 800.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A differential amplifier providing substantially symmetrical voltage transitions at an output thereof in response to differential input signals supplied thereto, the amplifier comprising:
    a current mirror coupled to a supply voltage source;
    a differential pair for receiving said differential input signals coupled to said current mirror and defining said output therebetween;
    a current source for coupling said differential pair to a reference voltage source; and
    a current path comprising an N-channel transistor in series with an additional current source coupled between a common control node of said current mirror and said reference voltage source, wherein said N-channel transistor comprises a gate terminal thereof coupled to receive at least one of said differential input signals.

2. The differential amplifier of claim 1 wherein said current mirror comprises first and second transistors.

3. The differential amplifier of claim 2 wherein said first and second transistors comprise P-channel transistors.

4. The differential amplifier of claim 1 wherein said differential pair comprises third and fourth transistors.

5. The differential amplifier or claim 4 wherein said third and fourth transistors comprise N-channel transistors.

6. The differential amplifier of claim 4 wherein said third and fourth transistors comprise substrate contacts thereof coupled to a bias signal input.

7. The differential amplifier of claim 1 wherein said current source comprises a fifth transistor.

8. The differential amplifier of claim 7 wherein said fifth transistor comprises an N-channel transistor having a gate terminal thereof coupled to said supply voltage source.

9. The differential amplifier of claim 1 wherein said N-channel transistor comprises a substrate contact thereof coupled to said bias signal input.

10. The differential amplifier of claim 1 wherein said additional current source comprises an additional N-channel transistor having a gate terminal thereof coupled to said supply voltage source.

11. A differential amplifier comprising:
    a current mirror comprising first and second transistors having first, second and control terminals thereof, said current mirror being coupled to a supply voltage source;
    a differential pair comprising third and fourth transistors having first, second, control and substrate terminals thereof, said differential pair being coupled to said current mirror;
    a current source comprising a fifth transistor having first, second and control terminals thereof, said current source being coupled to said differential pair and a reference voltage source;
    a current path coupled between a common control node of said current mirror and said reference voltage source; and
    a control circuit coupled to said substrate terminals of said third and fourth transistors for controlling a threshold voltage thereof, wherein said current path comprises a sixth transistor coupled to said second terminal of said fourth transistor and having first, second control and substrate terminals thereof; and an additional current source coupling said sixth transistor to said reference voltage source.

12. The differential amplifier of claim 11 wherein said first and second transistors comprise P-channel transistors and said first terminals thereof are coupled to said supply voltage source.

13. The differential amplifier of claim 11 wherein said control terminals of said first and second transistors are coupled to a second terminal of said second transistor.

14. The differential amplifier of claim 11 wherein said control terminals of said third and fourth transistors are coupled to respective first and second differential inputs to said differential amplifier.

15. The differential amplifier of claim 11 wherein said second terminals of said first and second transistors are coupled to said second terminals of said third and fourth transistors respectively.

16. The differential amplifier of claim 11 wherein said third and fourth transistors comprise N-channel transistors.

17. The differential amplifier of claim 11 wherein said second terminal of said fifth transistor is coupled to said first terminals of said third and fourth transistors.

18. The differential amplifier of claim 11 wherein said fifth transistor comprise an N-channel transistor and said control terminal thereof is coupled to said supply voltage line.

19. The differential amplifier of claim 11 comprising a bias signal input coupled to said substrate contacts of said third, fourth and sixth transistors.

20. The differential amplifier of claim 11 wherein said sixth transistor comprises an N-channel transistor.

21. The differential amplifier of claim 11 wherein said additional current source comprises an N-channel transistor having a control terminal thereof coupled to said supply voltage source.

22. The differential amplifier of claim 11 wherein said control terminal of said sixth transistor is coupled to said control terminal of said fourth transistor.

23. A method for controlling the substrate bias of a first differential amplifier comprising a second differential amplifier identical to said first differential amplifier with one input to said second differential amplifier coupled to said first differential amplifier and the second input of said second differential amplifier coupled to a reference voltage, said method comprising:

sensing a signal level at an output of said second differential amplifier; and controlling a substrate bias of said first differential amplifier based upon said sensed signal level of said second differential amplifier.

24. The method of claim 23 further comprising:

supplying an additional bias current to said first and second differential pairs to enable an increase in a pull-up current at said output without substantially increasing a corresponding pull-down current.

* * * * *